United States Patent [19]
Baker

[11] Patent Number: 5,315,186
[45] Date of Patent: May 24, 1994

[54] FREQUENCY AND PHASE LOCK DETECTOR

[75] Inventor: Ira Baker, Miami, Fla.

[73] Assignee: Sony Electronics Inc., Park Ridge, N.J.

[21] Appl. No.: 923,196

[22] Filed: Jul. 31, 1992

[51] Int. Cl.$^5$ .......................... H03L 5/26; H03L 7/06
[52] U.S. Cl. .................................. 307/527; 307/528; 328/133
[58] Field of Search .................. 307/525, 527, 528; 328/133, 134; 331/1 A, 25, DIG. 2

[56] References Cited

U.S. PATENT DOCUMENTS

| | | | |
|---|---|---|---|
| 4,267,514 | 5/1981 | Kimsey | 307/528 X |
| 4,473,805 | 9/1984 | Guhn | 328/134 X |
| 4,675,558 | 6/1987 | Serrone et al. | 328/134 X |
| 5,159,279 | 10/1992 | Shenoi et al. | 307/528 X |

*Primary Examiner*—Willis R. Wolfe
*Attorney, Agent, or Firm*—Jerry A. Miller; Pasquale Musacchio

[57] ABSTRACT

An improved frequency and phase lock detection circuit includes a first circuit for receiving a first signal and a second circuit for receiving a second signal. A detecting circuit detects that one of the first and second signals is being received by one of the first and second receiving circuits and produces a detect signal indicative thereof. A comparing circuit detects that the first and second signals have substantially the same frequency and phase and produces a compare signal indicative thereof. An output circuit receives the detect signal and the compare signal and produces a locked signal in response thereto which indicates that at least one of the first and second signals is being received and that the first and second signals are substantially identical in frequency and phase.

6 Claims, 1 Drawing Sheet

FREQUENCY AND PHASE LOCK DETECTOR

BACKGROUND

1. Field of the Invention

This invention relates generally to the field of frequency and phase lock detectors. More particularly, this invention relates to an improved frequency and phase lock detector which does not produce false lock indications when there is no signal present.

2. Background of the Invention

When electronic circuits are used to indicate when two signals are essentially identical, a false indication is often obtained when there is in fact no signal present. In this instance, although the two signals are technically identical, the indicating circuit would lead one to believe that two signals are present and locked. The present invention addresses this problem by providing an improved circuit to indicate when two signals are identical in phase and frequency without providing a false indication that they are identical in phase and frequency when there is no signal present.

SUMMARY OF THE INVENTION

It is an object of the present invention to provide an improved frequency and phase lock detection circuit which does not give false indications when no signal is present.

It is a feature that the present invention provides freedom from false indication that two signals are essentially identical when no signal is present.

It is an advantage that the present invention that the user is not fooled by false indications of locked conditions when no signal is present.

These and other objects, advantages and features of the invention will become apparent to those skilled in the art upon consideration of the following description of the invention.

In one embodiment of the present invention an improved frequency and phase lock detection circuit includes a first circuit for receiving a first signal and a second circuit for receiving a second signal. A detecting circuit detects that one of the first and second signals is being received by one of the first and second receiving circuits and produces a detect signal indicative thereof. A comparing circuit detects that the first and second signals have substantially the same frequency and phase and produces a compare signal indicative thereof. An output circuit receives the detect signal and the compare signal and produces a locked signal in response thereto which indicates that at least one of the first and second signals is being received and that the first and second signals are substantially identical in frequency and phase.

The features of the invention believed to be novel are set forth with particularity in the appended claims. The invention itself however, both as to organization and method of operation, together with further objects and advantages thereof, may be best understood by reference to the following description taken in conjunction with the accompanying drawing.

DETAILED DESCRIPTION OF THE INVENTION

Figure 1:
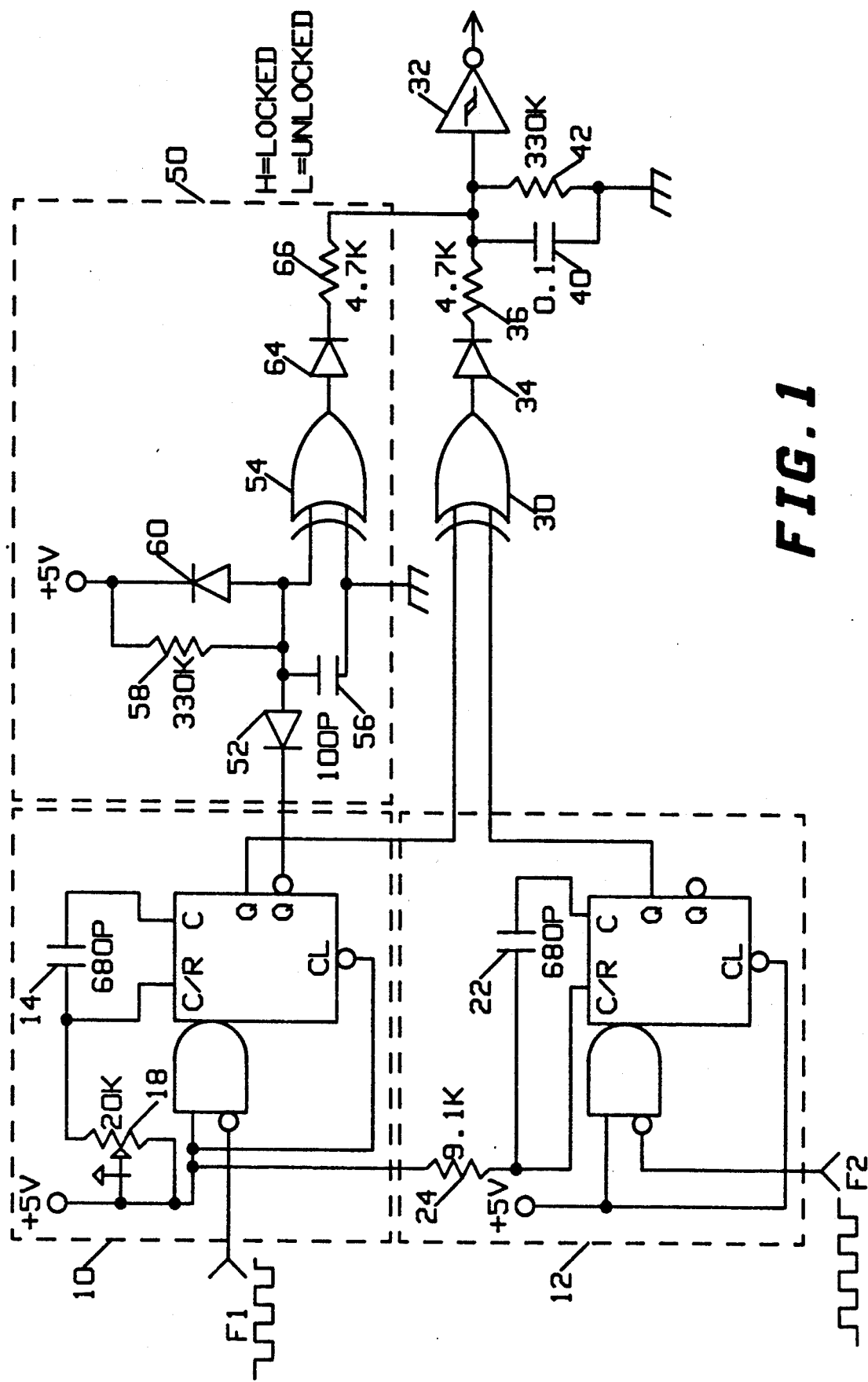
FIG. 1 is a circuit diagram of an embodiment of the present invention.

Turning now to FIG. 1, a circuit diagram of one embodiment of the present invention is shown in detail. With the circuit value shown, the circuit is designed to operate in the frequency range of approximately 44 to 48 Khz. However, the circuit will properly operate over a somewhat wider range of frequencies. With proper optimization of the component values, a similar circuit can be made to operate at any appropriate frequency range.

The two signals are applied to the circuit as signal $F_1$ and signal $F_2$ which are applied respectively to inputs of One-Shot multi-vibrators 10 and 12. One-Shot multi-vibrators 10 and 12 can be formed from, for example, industry standard HC123 integrated circuits. The pulse output duration from One-Shot 10 is established by capacitor 14. In a similar manner, the pulse output of One-Shot 12 is established by capacitor 22 operating in combination with resistor 24. Resistor 18 is a variable resistor used to compensate for circuit variations. Resistor 18 is adjusted to obtain identical pulse widths from the output of One-Shots 10 and 12. One-Shot circuits 10 and 12 provide pulse shaping for the input signals $F_1$ and $F_2$ so that a comparison can be made based upon the time of the falling edge of the signals applied to the respective inputs thereof.

The output of each One-Shot 10 and 12 is a stream of pulses which is applied to an EXCLUSIVE-OR Gate 30 (e.g., industry standard HC85). EXCLUSIVE-OR Gate 30 compares the two output pulse streams and provides a logic high output only if the two pulse streams are not identical. A logic low output is indicative that the input signals to the EXCLUSIVE-OR gate are substantially identical.

The output of EXCLUSIVE-OR Gate 30 drives a Schmidt Trigger 32 (e.g., industry standard HC14) through diode 34 (whose anode is connected to the output of EXCLUSIVE-OR Gate 30) and series resistor 36. The Schmidt Trigger 32 provides the lock indication signal at its output. In the current circuit, a logic high at the output of 32 indicates that the two signals $F_1$ and $F_2$ are locked and a logic low indicates that they are not locked. A capacitor 40 and a resistor 42 are connected from the input of Schmidt Trigger 32 to ground. This RC combination of 36, 40 and 42 provides a level of filtering to remove transient responses from the system.

In order to establish that at least one of signals $F_1$ and $F_2$ are present and thereby avoid false indications of lock when no signal is present, a detecting circuit 50 is provided. The output of the detecting circuit is a detect signal indicative that one of the signals is actually present. As shown, circuit 50 is connected to the inverting output of One-Shot circuit 10. However, this is not to be limiting since it could equally well be attached to the inverting input of One-Shot circuit 12. The point is that in order for a correct indication of lock to appear at the output of Schmidt Trigger 32, both of signals $F_1$ and $F_2$ must be present. Thus, inspecting for the presence of either signal $F_1$ or $F_2$ is adequate to establish that a correct indication of lock is possible.

The inverting output of One-Shot 10 is connected to the cathode of a diode 52. The anode of diode 52 is connected to one input of an EXCLUSIVE-OR Gate 54. The other input of EXCLUSIVE-OR Gate 54 is connected to ground. A capacitor 56 is coupled between the two inputs of the EXCLUSIVE-OR Gate. A combination of resistor 58 and diode 60 are connected in parallel between the first input of the EXCLUSIVE-OR Gate and the power supply, with the cathode connected to the power supply.

Whenever a constant stream of pulses appears at the input of the detecting circuit 50, diode 60 discharges capacitor 56 and the constant stream of pulses through diode 52 will not permit capacitor 56 to charge. This condition is indicative that there is a signal present at the input of One-Shot 10 and causes the output of EXCLUSIVE-OR Gate 54 to go low. More specifically, when there is a low output at the inverting output of One-Shot 10 (signal present), diode 52 conducts drainting charge from capacitor 56 This in turn makes both inputs of EXCLUSIVE-OR Gate 54 low and thus the output of EXCLUSIVE-OR Gate 54 low. In this condition, diode 64 is reverse biased permitting the output of EXCLUSIVE-OR Gate 30 to control the voltage applied to the input of Schmidt Trigger 32, and thus its output depends upon whether or not the two input signals are locked.

If there is no signal present at the input of One-Shot 10, the inverting output of One-Shot 10 is high. In this case, capacitor 56 is charged through resistor 58 producing a high input at the top input of EXCLUSIVE-OR 54 and thus a high output from EXCLUSIVE-OR 54. This causes diode 64 to charge capacitor 40 through resistor 66 raising the input to Schmidt trigger 32 to go high and its output to thus go low indicating an unlocked condition. Those skilled in the art will appreciate that other embodiments of this output circuit are possible.

When a pair of signals $F_1$ and $F_2$ are both present, the detecting circuit 50 detects that $F_1$ is indeed present. Detecting circuit 50 then permits an indication that the two signals from the output of One-Shot 10 and One-Shot 12 to pass through EXCLUSIVE-OR Gate 30 to Schmidt Trigger 32 providing an indication at the output that signals $F_1$ and $F_2$ are locked. If signal $F_1$ is not present, the output of EXCLUSIVE-OR Gate 30 is not permitted to toggle the Schmidt Trigger 32.

Those skilled in the art will recognize that many other possible implementations of the present circuit are possible. Although EXCLUSIVE-OR Gates and a hard wired And circuit is used in the present embodiment, the relative simplicity of the circuit is conducive to use of left over Gates for implementing the present function using a variety of equivalent circuits.

Thus, it is apparent that in accordance with the present invention, an apparatus that fully satisfies the objectives, aims and advantages is set forth above. While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

What is claimed is:

1. An improved frequency and phase lock detection circuit, comprising in combination:
    first receiving means for receiving a first signal;
    first shaping means including a first one-shot multi-vibrator for shaping said first signal into a first pulse train, wherein said first one-shot multi-vibrator includes means for adjusting a pulse width of pulses of said first pulse train;
    second receiving means for receiving a second signal;
    second shaping means including a second one-shot multi-vibrator for shaping said second signal into a second pulse train;
    detecting means for detecting that one of said first and second signals is being received by one of said first and second receiving means, and for producing a detect signal indicative thereof;
    comparing means for detecting that said first and second signals have substantially the same frequency and phase and for producing a compare signal indicative thereof; and
    output means, receiving said detect signal and said compare signal and for producing a locked signal in response thereto which indicates that at least one of said first and second signals is being received and that said first and second signals are substantially identical in frequency and phase.

2. An improved frequency and phase lock detection circuit, comprising in combination:
    first receiving means for receiving a first signal;
    second receiving means for receiving a second signal;
    detecting means for detecting that one of said first and second signals is being received by one of said first and second receiving means, and for producing a detect signal indicative thereof;
    comparing means for detecting that said first and second signals have substantially the same frequency and phase and for producing a compare signal indicative thereof;
    output means, receiving said detect signal and said compare signal and for producing a locked signal in response thereto which indicates that at least one of said first and second signals is being received and that said first and second signals are substantially identical in frequency and phase; and
    filtering means for filtering transients prior to said output means.

3. An improved frequency and phase lock detection circuit, comprising in combination:
    first receiving means for receiving a first signal;
    second receiving means for receiving a second signal;
    first shaping means including a one-shot multi-vibrator for shaping said first signal into a first pulse train;
    second shaping means including a one-shot multi-vibrator for shaping said second signal into a second pulse train;
    means for adjusting a pulse width of pulses of said first pulse train;
    detecting means for detecting that one of said first and second signals is being received by one of said first and second receiving means, and for producing a detect signal indicative thereof;
    comparing means including an EXCLUSIVE-OR gate for detecting that said first and second signals have substantially the same frequency and phase and for producing a compare signal indicative thereof; and
    output means, receiving said detect signal and said compare signal and for producing a locked signal in response thereto which indicates that at least one of said first and second signals is being received and that said first and second signals are substantially identical in frequency and phase;

said output means comprising a hard wired NAND circuit including:
- first series connected diode and resistor forming a first input path;
- second series connected diode and resistor forming a second input path;
- a schmidt trigger having an input connected to said first and second input path; and
- filtering means coupled to said schmidt trigger input to filter transients from said input.

4. An improved frequency and phase lock detection circuit, comprising in combination:
- first receiving means for receiving a first signal;
- second receiving means for receiving a second signal;
- detecting means for detecting that one of said first and second signals is being received by one of said first and second receiving means, and for producing a detect signal indicative thereof;
- comparing means for detecting that said first and second signals have substantially the same frequency and phase and for producing a compare signal indicative thereof; and
- output means, receiving said detect signal and said compare signal and for producing a locked signal in response thereto which indicates that at least one of said first and second signals is being received and that said first and second signals are substantially identical in frequency and phase wherein said output means includes a hard wired NAND circuit.

5. The apparatus of claim 4, wherein said hard wired NAND circuit includes:
- first series connected diode and resistor forming a first input path;
- second series connected diode and resistor forming a second input path;
- a schmidt trigger having an input connected to said first and second input path.

6. The apparatus of claim 5, further comprising filter means coupled to said schmidt trigger input to filter transients from said input.

* * * * *